United States Patent
Chavez-Clemente et al.

(10) Patent No.: US 10,825,714 B2
(45) Date of Patent: Nov. 3, 2020

(54) STRETCHING RETENTION PLATE FOR ELECTRONIC ASSEMBLIES

(71) Applicant: INTEL CORPORATION, Santa Clara, CA (US)

(72) Inventors: Daniel Chavez-Clemente, Chandler, AZ (US); Joshua D. Heppner, Chandler, AZ (US); Naida Duranovic, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 1026 days.

(21) Appl. No.: 15/089,480

(22) Filed: Apr. 2, 2016

(65) Prior Publication Data

US 2017/0287771 A1   Oct. 5, 2017

(51) Int. Cl.
*H01L 21/687* (2006.01)
*H01L 23/00* (2006.01)
*H01L 23/538* (2006.01)

(52) U.S. Cl.
CPC .. *H01L 21/68785* (2013.01); *H01L 21/68721* (2013.01); *H01L 21/68728* (2013.01); *H01L 24/75* (2013.01); *H01L 23/5387* (2013.01); *H01L 2224/7598* (2013.01); *H01L 2224/75704* (2013.01); *H01L 2224/75901* (2013.01)

(58) Field of Classification Search
CPC ............... H01L 21/68785; H01L 24/75; H01L 21/68721; H01L 21/68728; H01L 23/5387; H01L 2224/7598; H01L 2224/75901; H01L 2224/75704; Y10T 29/53265
See application file for complete search history.

(56) References Cited

U.S. PATENT DOCUMENTS

| | | | | |
|---|---|---|---|---|
| 4,422,547 A | * | 12/1983 | Abe | .......................... G03F 1/66 |
| | | | | 206/454 |
| 5,743,409 A | * | 4/1998 | Nakahara | .................. G03F 1/66 |
| | | | | 206/710 |
| 2002/0050157 A1 | | 5/2002 | Kennerknecht et al. | |
| 2007/0031600 A1 | | 2/2007 | Devitt | |
| 2007/0175499 A1 | | 8/2007 | Yassour | |
| 2010/0199736 A1 | | 8/2010 | Fujita et al. | |
| 2014/0366600 A1 | | 12/2014 | Kozaki et al. | |

FOREIGN PATENT DOCUMENTS

| | | | |
|---|---|---|---|
| TW | 201422433 A | | 6/2014 |
| TW | 201431762 A | | 8/2014 |

OTHER PUBLICATIONS

International Search Report received for PCT Patent Application No. PCT/US2017/025157, dated Jul. 18, 2017, 3 pages.

* cited by examiner

*Primary Examiner* — Sarang Afzali
*Assistant Examiner* — Ruth G Hidalgo-Hernandez

(57) ABSTRACT

A substrate retention plate system for holding a substrate for processing in an electronic device manufacturing process is described. The retention plate system includes a top plate and a bottom plate to sandwich a flexible substrate. Additionally, the top plate includes a number of cams to stretch the flexible substrate across the bottom plate.

24 Claims, 16 Drawing Sheets

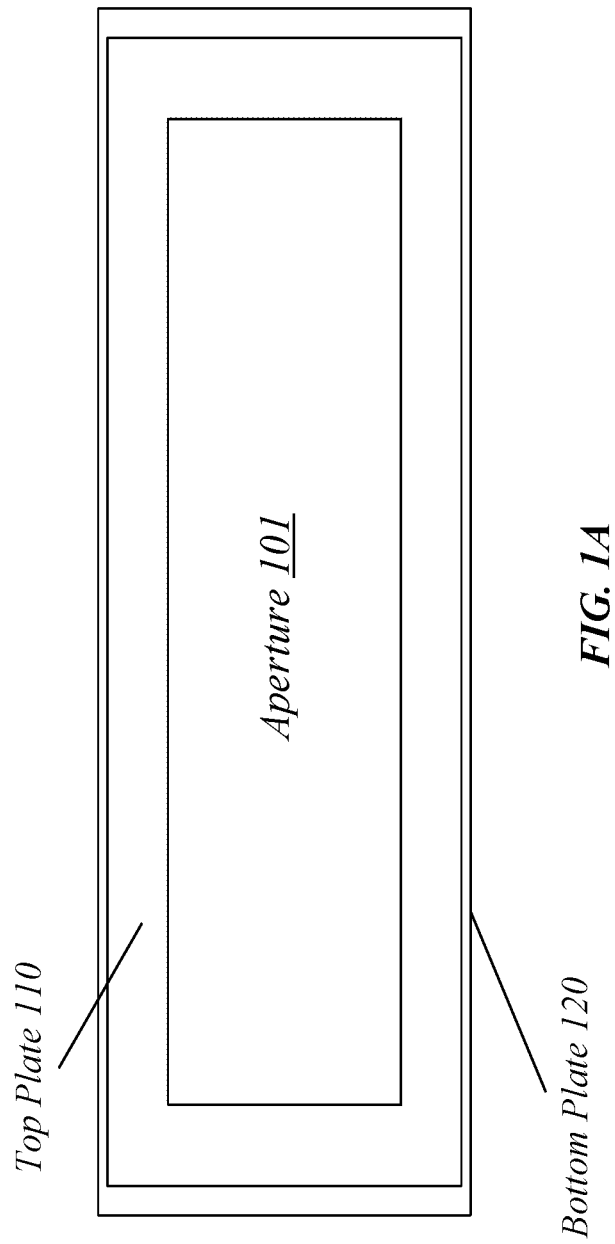

STRETCHING RETENTION PLATE FOR ELECTRONIC ASSEMBLIES

TECHNICAL FIELD

Embodiments herein generally relate to electronic assemblies and electronic assembly manufacturing.

BACKGROUND

Electronic device substrates typically undergo a multi-step process during manufacturing. During the process, the substrate is often held or fixed using a retention device, or retention plate. Due to current retention plates, even a slight amount of flexibility in the substrate can result in wrinkling or movement of the substrate during manufacturing.

BRIEF DESCRIPTION OF THE DRAWINGS

FIG. 1A illustrates an overhead view of a first example retention plate system.

DETAILED DESCRIPTION

Various embodiments may be generally directed to retention plates to stretch substrates during electronic device manufacturing. In particular, some embodiments may comprise a retention plate system having a cam to stretch and hold in tension a flexible substrate for processing. For example, embodiments can be implemented to stretch and prevent wrinkling of flexible substrates during a semiconductor processing technique.

Various embodiments can be implemented in a manufacturing process to manufacture flexible electronic devices, such as, for example, semiconductor devices. In particular, embodiments can be implemented to provide a retention plate to stretch and retain (e.g., in tension, or the like) a flexible substrate for processing in an electronic device manufacturing process.

In some examples, a retention plate system having a top plate and a bottom plate is provided. The top plate can include a number of cams arranged to stretch and retain a flexible substrate. The bottom and/or the top plate can include a number of magnets to hold the plates in position during use. During operation, a flexible substrate can be positioned between the top plate and the bottom plate. The flexible substrate can be squeezed between the plates while the cams operate to stretch and retain the substrate in position for manufacturing. For example, the cams can be positioned to actuate away from each other to stretch the flexible substrate as force is applied to the cams.

In some examples, each of the top and bottom plate can include cams arranged to stretch and maintain in tension a flexible substrate. With some examples, the cams can be arranged in a self locking manner to maintain the flexible substrate in tension during operation.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Figure 1B:
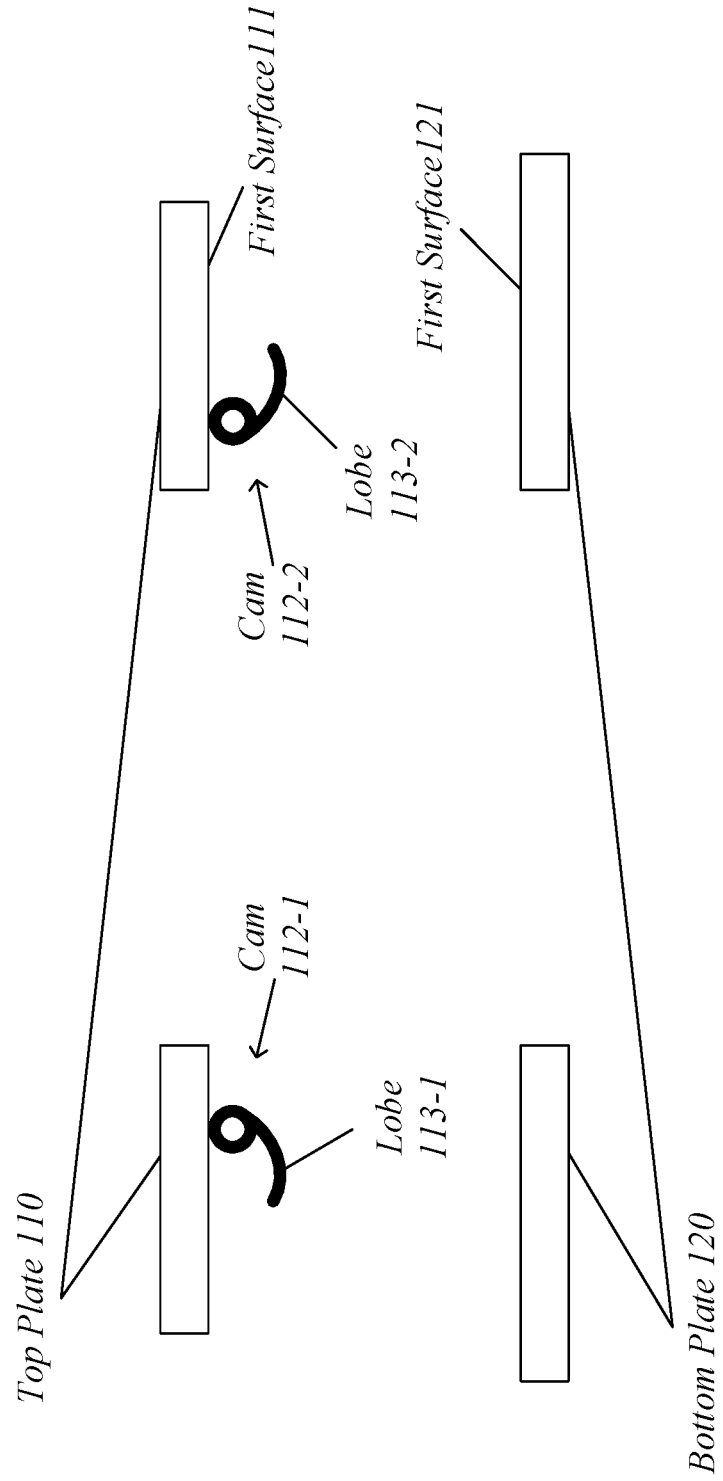
FIG. 1B illustrates a cut-away side view of the first example retention plate system.

FIGS. 1A and 1B illustrate a top and a cut-away side view, respectively, of a retention plate system 100. In general, the retention plate system 100 can be implemented to fix a substrate (e.g., refer to FIGS. 2A-2C and FIG. 9) during manufacturing of an electronic device. In particular, the retention plate system 100 can be implemented to support, stretch, and maintain, a flexible substrate for processing in an electronic device manufacturing process. For example, the retention plate system 100 can be implemented to fix a flexible substrate during a flip chip manufacturing process, or the like.

The retention plate system 100 includes a top plate 110 and a bottom plate 120. In general, the top plate 110 and bottom plate 120 can be arranged to have a flexible substrate disposed between the plates and to stretch the flexible substrate in a first direction as the flexible substrate is squeezed between the top plate 110 and the bottom plate 120 in a second direction (e.g., refer to FIGS. 2A-2C). The top plate 110 and/or the bottom plate 120 can include an aperture 101 to expose a portion of the substrate to be processed during an electronic device manufacturing process. The top plate 110 and bottom plate 120 can be any of a variety of materials, such as, for example, aluminum, steel, or the like.

In general, the top plate 110, the bottom plate 120, and the aperture 101 can have any of a variety of shapes. For example, the top plate 110 and bottom plate 120 can be square, rectangular, circular, or have an otherwise polynomial share. Furthermore, the aperture 101 can be square, rectangular, circular, or have an otherwise polynomial shape. It is noted, that the aperture 101 is depicted having the same shape as the top plate 110 and bottom plate 120. However, this is not intended to be limiting. In particular, the aperture 101 could be square while the top plate 110 is rectangular or the aperture 101 could be circular while the top plate 110 is square. In some examples, the top plate 110, bottom plate 120, and aperture 101 can have a size and/or shape consistent with an electronic device (or array of electronic devices) to be manufacture on a flexible substrate. For example, the top plate 110, bottom plate 120, and aperture 101 can be sized to accommodate a flexible substrate to be processed in an electronic device manufacturing process to manufacture an array of electronic devices (e.g., computing devices, circuits, or the like). In some examples, the top plate 110, bottom plate 120, and aperture 101 can be sized to accommodate a flexible substrate to be processed in an electronic device manufacturing process to manufacture a wearable electronic device (e.g., watch, shirt, belt, glove, scarf, or the like). Examples are not limited in this context.

In some examples, the top plate 110 and bottom plate 120 can have the same size and/or shape. In general, the top plate 110 and bottom plate 120 can have a size and/or shape consistent with a flexible substrate (e.g., refer to FIGS. 2A-2C) to be processed. For example, the bottom plate 120 can have a size and shape to support a flexible substrate when the flexible substrate is in an un-stretched state (e.g., refer to FIG. 2A) while the top plate 110 can have a size and shape to stretch a portion of the flexible substrate to be processed. Additionally, the aperture 101 can have a size and shape to expose a sub-portion of the stretched portion of the flexible substrate to be processed. Said differently, the aperture 101 can have a size and shape to expose a portion of the flexible substrate upon which electronic devices (e.g. refer to FIG. 9) are to be manufactured.

The top plate 110 includes a number of cams (or camming devices) 112 to stretch, and retain in tension, a flexible substrate. In particular, the top plate 110 is depicted including the cam 112-1 and 112-2. The cams 112 are coupled (e.g., mechanically, epoxied, or the like) to a first surface 111 (e.g., bottom surface, or the like) of the top plate 110. The cams 112-1 and 112-2 are arranged such that during operation, a flexible substrate can be squeezed between the top plate 110 and the bottom plate 120 and the cams can exert a lateral force in opposing directions to stretch the flexible substrate across the aperture 101. Said differently, as the top plate 110 and bottom plate 120 are pressed together, the cams 112-1 and 112-2 operate to stretch the flexible substrate. An example of this is described with reference to FIGS. 2A-2C.

In general, the cams 112 can be any of a variety of convex shaped lobes 113 (e.g., lobes 113-1 and 113-2 are depicted) arranged with the convex lobes 113 facing the bottom plate 120, or facing a flexible substrate disposed between the bottom plate 120 and the top plate 110. The convex shaped lobes 113 can be disposed on the first surface 111 of the top plate 110 to exert a force in a direction away from first surface 111 of the top plate 110 and biased to return to an original position. For example, the cams 112 can be spring loaded, comprise an elastic material biased to return the convex lobes 113 to an original position, or the like. It is noted, that the overall shape of the cams 112 (and particularly the lobes 113) can be configured to exert lateral force or pressure against the flexible substrate to stretch the flexible substrate across the aperture 101 and retain the flexible substrate, in tension during a manufacturing process. This is described in greater detail below, for example, with respect to FIGS. 2A-2C.

In some examples, the cams 112 can include a coating, such as, a rubber coating, to provide friction between the cam and the flexible substrate to pull the end of flexible substrate and stretch the flexible substrate. For example, the cams 112 can be coated in a polymer coating to increase a friction between the cams 112 and the flexible substrate. In some examples, the polymer coating can include various particles (e.g., sand, glass, or the like) to increase a friction of the cams against a flexible substrate.

In some examples, the bottom plate 120 can include a coating and/or treatment to reduce friction between the bottom plate and the flexible substrate to allow the flexible substrate to glide, slip, or move along the surface of the bottom plate 120. For example, a first surface 121 (e.g., top surface, or the like) of the bottom plate 120 can include a silicon coating to reduce a friction between the bottom plate 120 and the flexible substrate. The flexible substrate can be disposed (e.g., refer to FIG. 2A) on the first surface and stretched across the aperture 111 by action of the cams 112 and the top plate 110 and bottom plate 120 squeezing the flexible substrate.

Figure 2A:
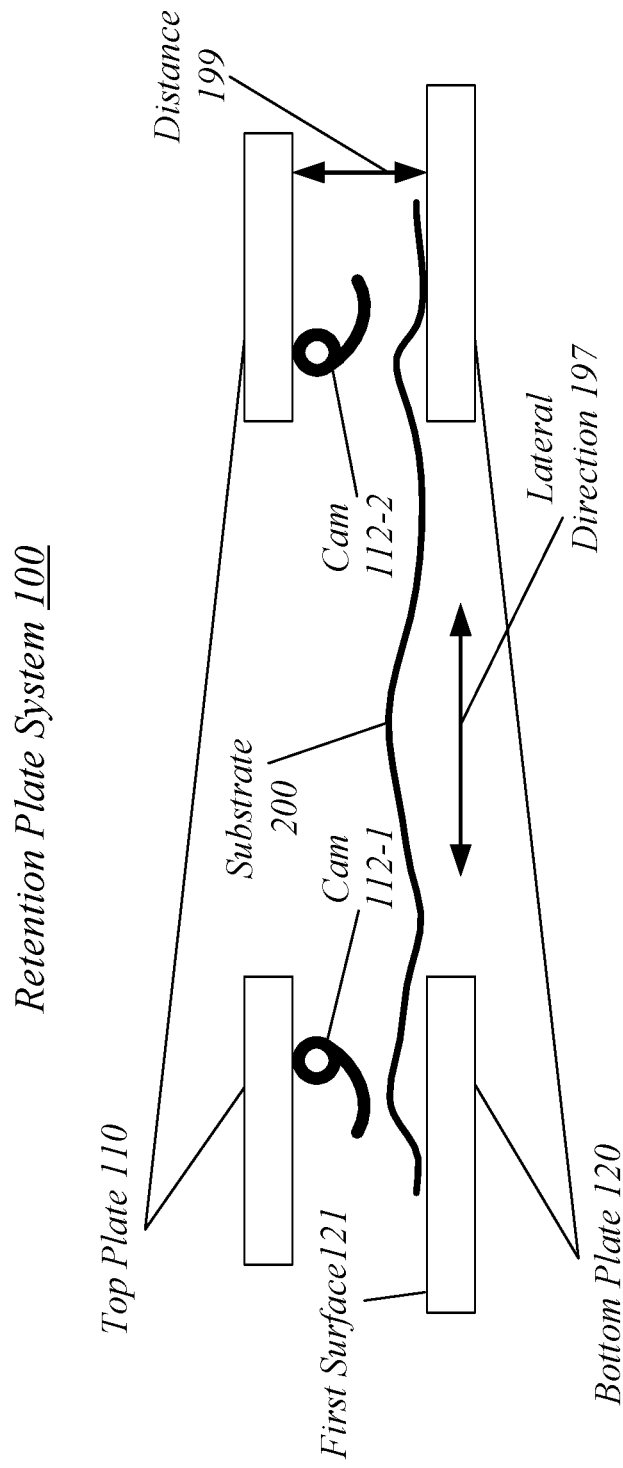
FIG. 2A illustrates a cut-away side view of the first example retention plate system and a flexible substrate in an un-stretched state.
Figure 2B:
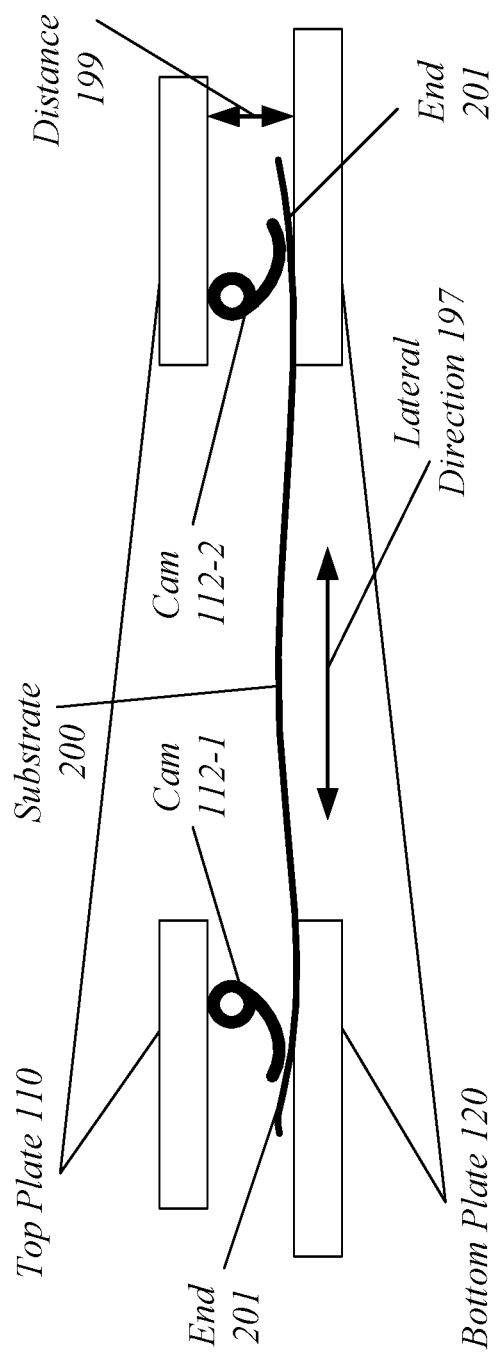
FIG. 2B illustrates a cut-away side view of the first example retention plate system and a flexible substrate in a semi-stretched state.
Figure 2C:
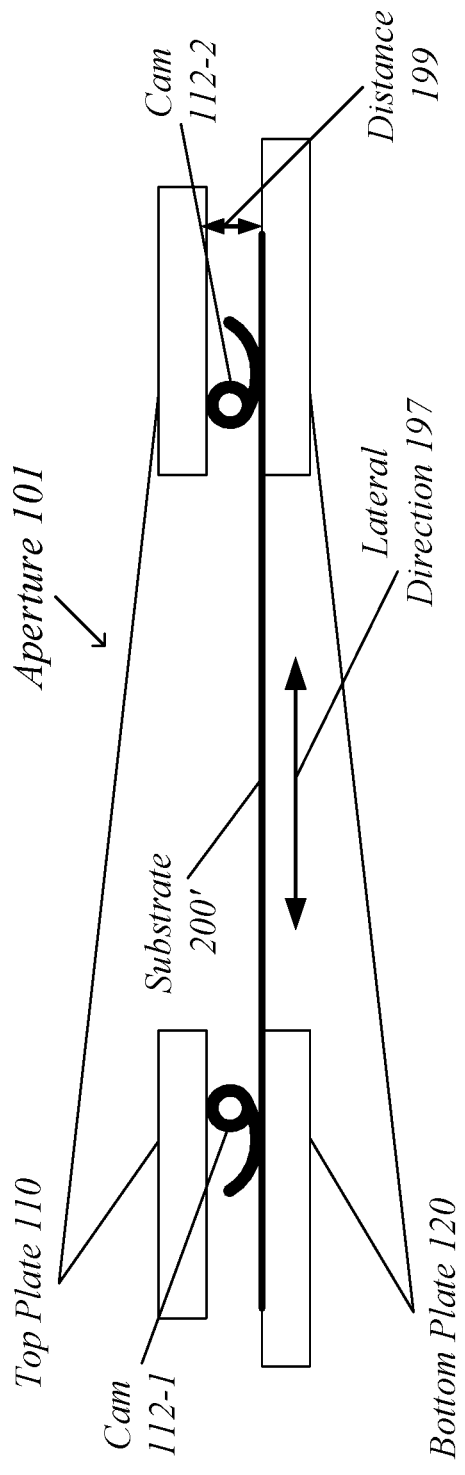
FIG. 2C illustrates a cut-away side view of the first example retention plate system and a flexible substrate in a stretched state.

FIGS. 2A-2C depict a side cut-away view of the retention plate system 100 and a flexible substrate 200. In general, these figures depict the flexible substrate 200 at various states of tension. In particular, FIG. 2A depicts the flexible substrate 200 in an un-stretched state; FIG. 2B depicts the flexible substrate in a semi-stretched state; and FIG. 2C depicts the flexible substrate in a stretched state. It may be said, that FIGS. 2A-2C depict the flexible substrate 200 sandwiched, or squeezed between the top plate 110 and bottom plate 120 to stretch the flexible substrate across the bottom plate 120. In particular, these figures depict the top plate 110 and bottom plate 120 squeezed together with a flexible substrate between them to stretch a portion of the flexible substrate across an aperture in either or both of the top and bottom plates.

Turning more specifically to FIG. 2A, the retention plate system 100 is depicted with the flexible substrate 200 disposed between the top plate 110 and the bottom plate 120. The top plate 110 and the bottom plate 120 are spaced apart from each other at this point, or said differently, the top plate 110 is not in contact with the bottom plate 120 and/or the flexible substrate 200. The flexible substrate 200 is supported and/or resting on the bottom plate 120. As depicted, the flexible substrate is loose, or said differently, is not in a taught or stretched state. In general, the flexible substrate 200 can be any flexible substrate to be processed in an electronic device manufacturing process. For example, the flexible substrate 200 can be a polyimide material substrate. It is noted, that in a loose state, the flexible substrate 200 may be supported by the bottom plate 120. In particular, the flexible substrate 200 can be disposed on the first surface 121 of the bottom plate 120. However, the flexible substrate 200 may sag, wrinkle, or otherwise deform, even slightly as it is in an un-stretched state. Said differently, the flexible substrate is not parallel to the plane of the first surface 121. Accordingly, a distance 199 between the top plate 110 and bottom plate 120 can be reduced to stretch the flexible substrate in the lateral direction 197.

Turning more specifically to FIG. 2B, the top plate 110 is lowered onto the flexible substrate 200 such that the cams 112-1 and 112-2 are in physical contact with the flexible substrate 200. In particular, the cams 112 may contact respective ends 201 of the flexible substrate 200. As the top plate 110 is moved towards the bottom plate 120 (or the distance 199 is decreased) to squeeze the flexible substrate 200 between the top plate 110 and bottom plate 120, the cams 112-1 and 112-2 may contact the flexible substrate 200 and begin to stretch the flexible substrate 200 by operating to pull respective ends of the flexible substrate 200 away from each other. That is, the cams 112 operate to stretch the flexible substrate 200 in the lateral direction 197. In particular, the cams 112-1 and 112-2 can operate to remove wrinkles from the flexible substrate 200. Said differently, the cams 112 can contact ends of the flexible substrate and exert lateral force (e.g., in direction 197) on the ends of the substrate to stretch the portion of the flexible substrate between the cams 112. In some examples, the cams 112 to increase an amount of tension applied to respective ends 201 of the flexible substrate 200 in lateral directions away from a center of the flexible substrate 200 as the distance between the top plate 110 and the bottom plate 120 decreases.

Turning more specifically to FIG. 2C, the top plate 110 is again lowered onto the flexible substrate 200 such that the cams 112-1 and 112-2 are rotated away from each other to stretch the flexible substrate 200 across the aperture 101. In particular, the cams 112 apply tension to the flexible substrate 200 to stretch the flexible substrate 200 into a substantially flat plane parallel to a plane for the top plate 110 and bottom plate 120 (e.g., the flexible substrate 200' can be in a stretched state, or the like). In particular, as depicted, the flexible substrate 200 is in a taught or stretched state. Furthermore, the cams 112-1 and 112-2 are arranged to retain the flexible substrate 200 in the taught or stretched state until the top plate 110 is removed from the bottom plate 120. In some examples, the cams 112 (and particularly the lobes 113 of the cams) are sized to exert a lateral force on the flexible substrate 200 to remove wrinkles from the flexible substrate 200. It is noted, that the amount to which the cams 112 stretch the flexible substrate 200 and the amount of tension kept in the flexible substrate 200 during operation may depend upon the size, material, or construction, of the flexible substrate. In general, however, the cams 112 operate to keep wrinkles and other imperfections or deformities out of the flexible substrate 200.

Furthermore, it is worthy to note, that during a manufacturing process, the flexible substrate 200 may expand (e.g., due to heat, or the like). However, as the cams 112-1 and 112-2 are compliant in directions away from each other the flexible substrate 200 can expand but be retained in a stretched or taught state as the cams 112-1 and 112-2 self-lock in the directions towards each other.

Figure 3:
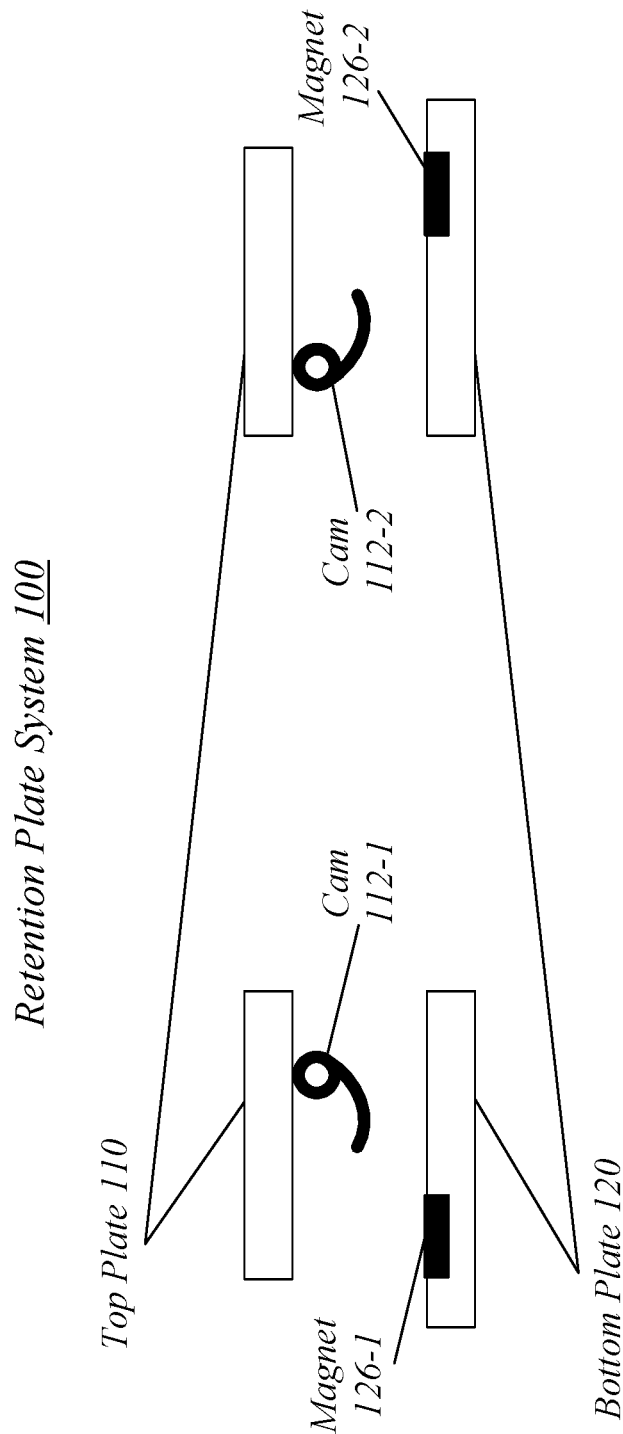
FIG. 3 illustrates a cut-away side view of a second example retention plate system.

FIG. 3 illustrates a side cut-away view of an example implementation of the retention plate system 100. As depicted, the retention plate system 100 includes the top plate 110 and the bottom plate 120. The top plate 110 includes the cams 112-1 and 112-2. Furthermore, the bottom plate 120 can include a number of magnets 126 to maintain or hold the retention plate system 100 together during use. In particular, the magnets 126 can hold the top plate 110 onto the bottom plate 120. Furthermore, in some examples, the magnets 126 can have a strength to retain the top plate 110 and the bottom plate 120 in a squeezed position with the flexible substrate between the top plate 110 and bottom plate 120. More specifically, the magnets 126 can have a strength to magnetically attract the top plate 110 and overcome the bias or force exerted by the cams 112 against the flexible substrate. Accordingly, the magnets 126 can operate to retain the top plate 110 and bottom plate 120 in a squeezed position and maintain the flexible substrate in a stretched state (e.g., FIG. 2C). It is noted that the bottom plate 120 can include any number of magnets. Magnets 126-1 and 126-2 are depicted for purposes of clarity, however, this is not intended to be limiting.

Figure 4:
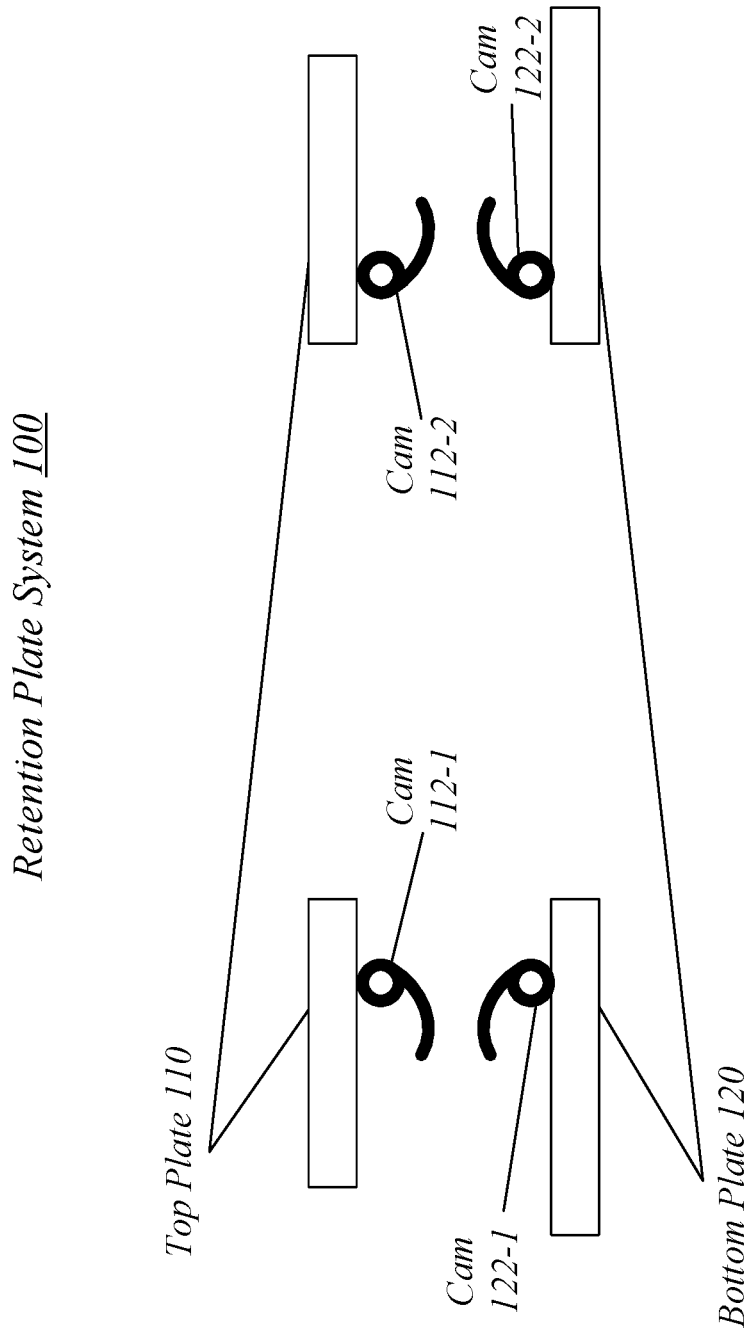
FIG. 4 illustrates a cut-away side view of a third example retention plate system.

FIG. 4 illustrates a side cut-away view of an example implementation of the retention plate system 100. As depicted, the retention plate system 100 includes the top plate 110 and the bottom plate 120. The top plate 110 includes the cams 112-1 and 112-2. Furthermore, the bottom plate 120 includes cams 122-1 and 122-2 arranged to operate in conjunction with cams 112-1 and 112-2 to stretch and retain a flexible substrate (e.g., flexible substrate 200, or the like) in a taught state for processing.

Figure 5:
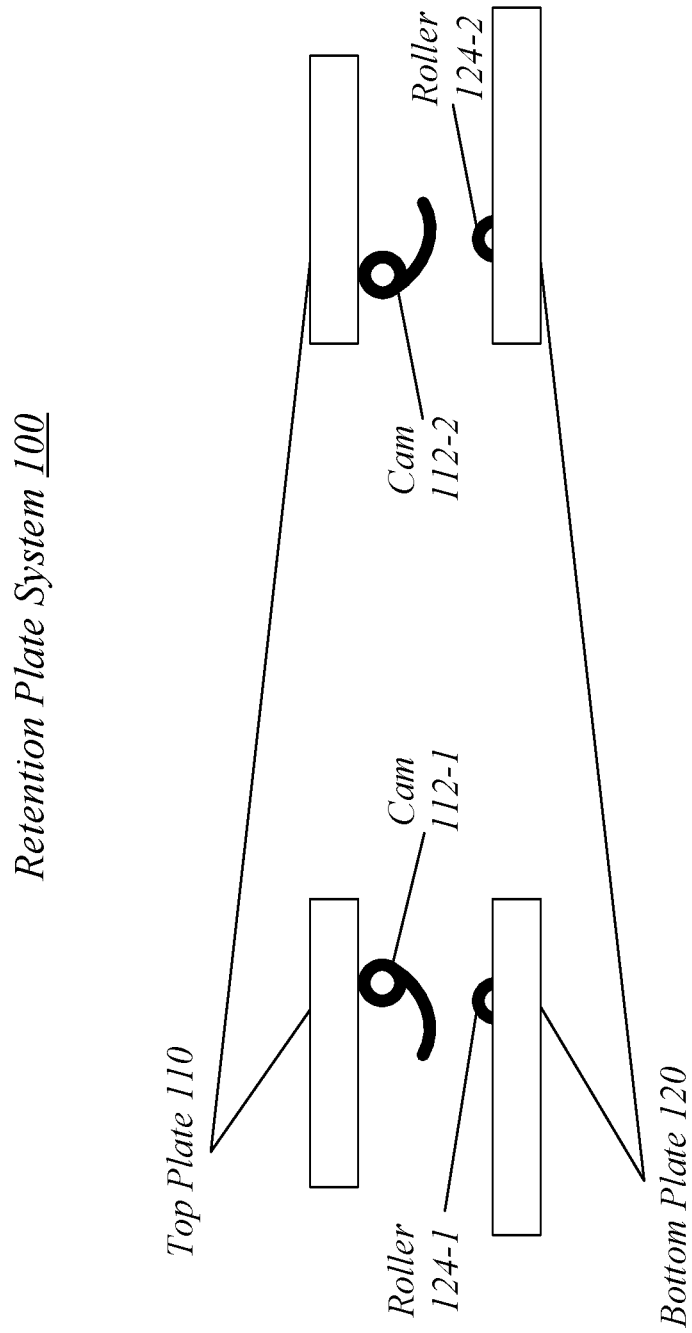
FIG. 5 illustrates a cut-away side view of the fourth example retention plate system.

FIG. 5 illustrates a side cut-away view of an example implementation of the retention plate system 100. As depicted, the retention plate system 100 includes the top plate 110 and the bottom plate 120. The top plate 110 includes the cams 112-1 and 112-2. Furthermore, the bottom plate 120 includes rollers 124 to allow a flexible substrate (e.g., the flexible substrate 200, or the like) to move (e.g., over rollers 126) along the surface of the bottom plate 120. In general, the bottom plate 120 can include any number of rollers 124. For example, rollers 124-1 and 124-2 are depicted for purposes of clarity, however, this is not intended to be limiting. In some examples, the rollers 124 can be ball bearings, glide rollers, or other mechanical rolling devices.

In some examples the bottom plate 120 can include both magnets 126 and cams 122 or rollers 124.

Figure 6:
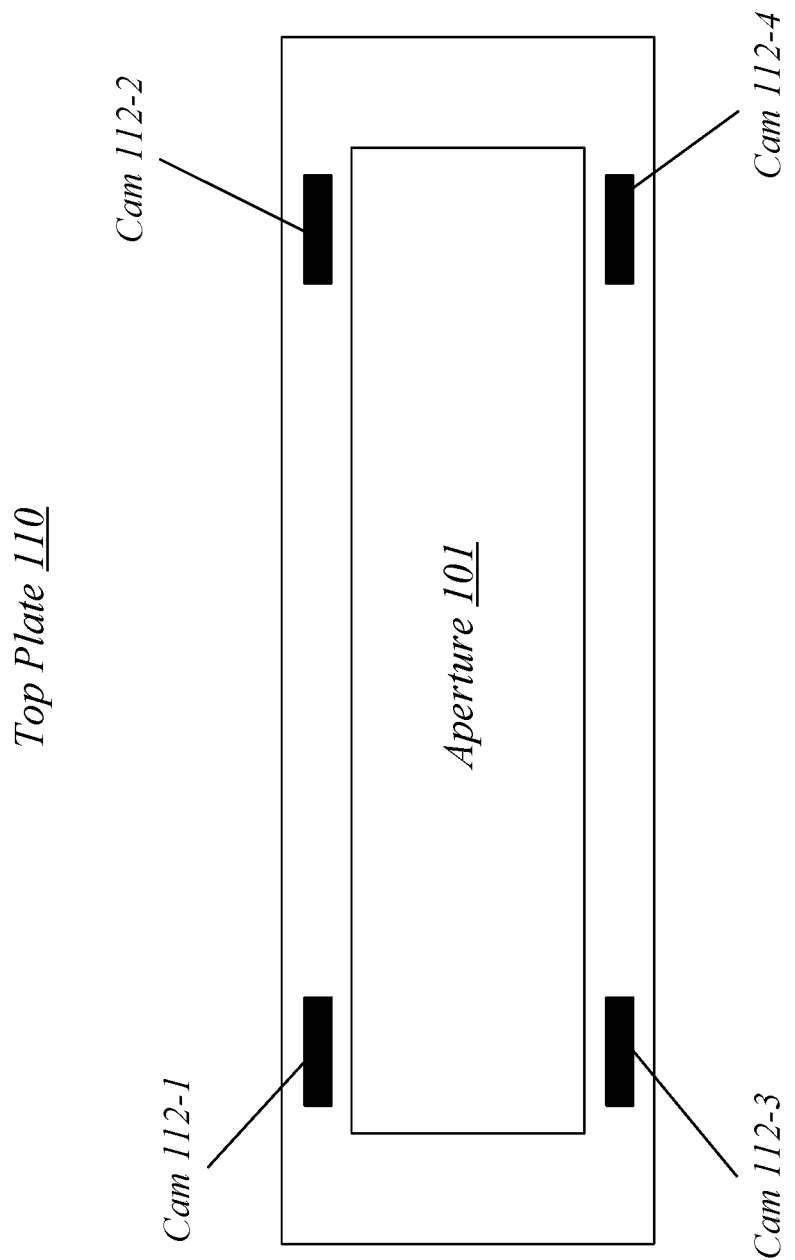
FIG. 6 illustrates a bottom view of a first example top plate of a retention plate system.

FIG. 6 illustrates a bottom view of an example implementation of the top plate 110. In particular, a view of the portion of the top plate 110 onto which the cams 112 are disposed is depicted. As can be seen, the top plate 110 includes the aperture 101. Furthermore, cams 112-1, 112-2, 112-3, and 112-4 are depicted. Specifically, this figure depicts the top plate 110 including a cam 112 arranged in each corner of the top plate 110. Accordingly, during operation, the cams 112-1, 112-2, 112-3, and 112-4 can operate to pull respective corners of a flexible substrate (e.g., the flexible substrate 200) away from each other to stretch, and retain in a taught state, the flexible substrate.

Figure 7:
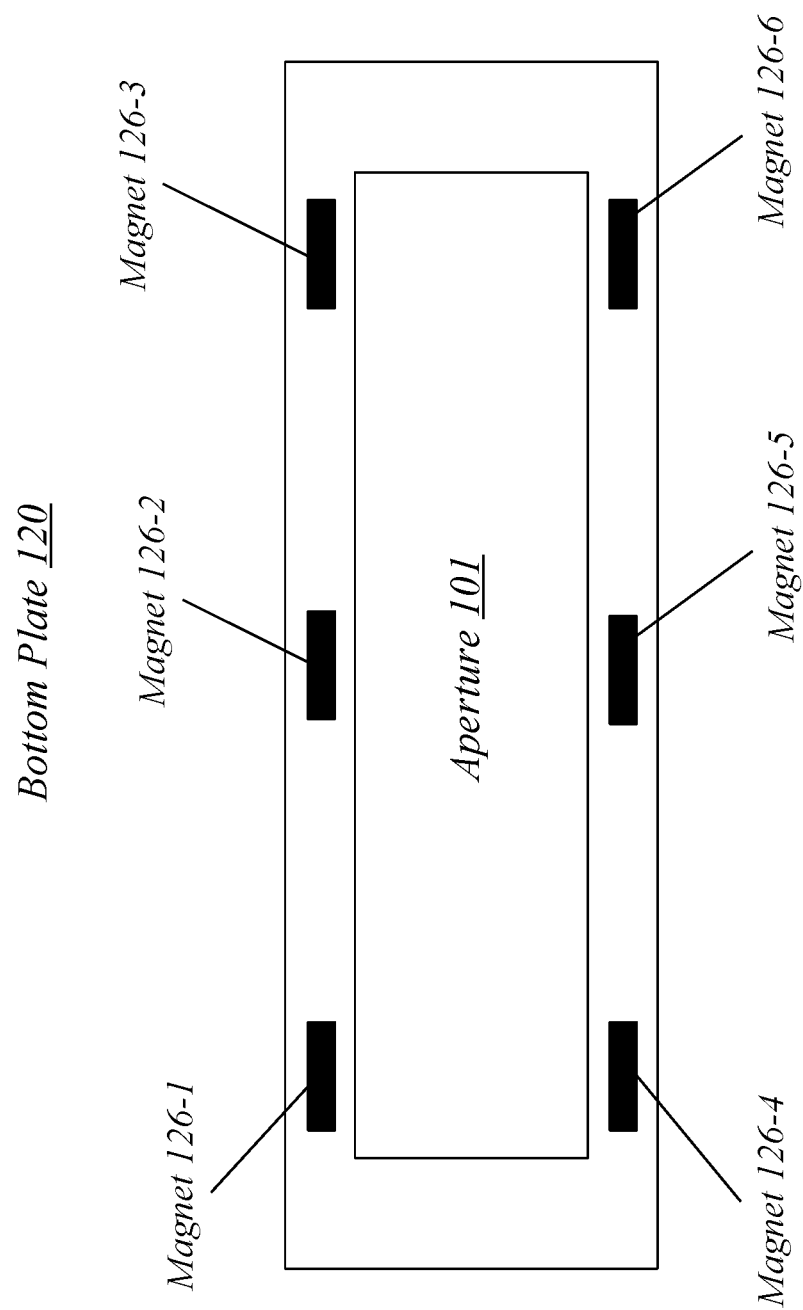
FIG. 7 illustrates a top view of a first example bottom plate of a retention plate system.

FIG. 7 illustrates a top view of an example implementation of the bottom plate 120. In particular, a view of the portion of the bottom plate 120 onto which the flexible substrate may be disposed is depicted. As can be seen, the bottom plate 120 includes the aperture 101. Furthermore, magnets 126-1, 126-2, 126-3, 126-4, 126-5, and 126-6 are depicted. Specifically, this figure depicts the bottom plate 120 including multiple magnets along each edge to hold the top plate onto the bottom plate 120. In some examples, the number and/or strength of magnets may be based on the elasticity of a flexible substrate to be sandwiched by the retention plate system 100, the force exerted by the cams 112, or a combination of both. Accordingly, during operation, the magnets 126-1, 126-2, 126-3, 126-4, 126-5, and 126-6 can operate to hold the top plate against the bottom plate, thereby, retaining the flexible substrate in a stretched state.

Figure 8:
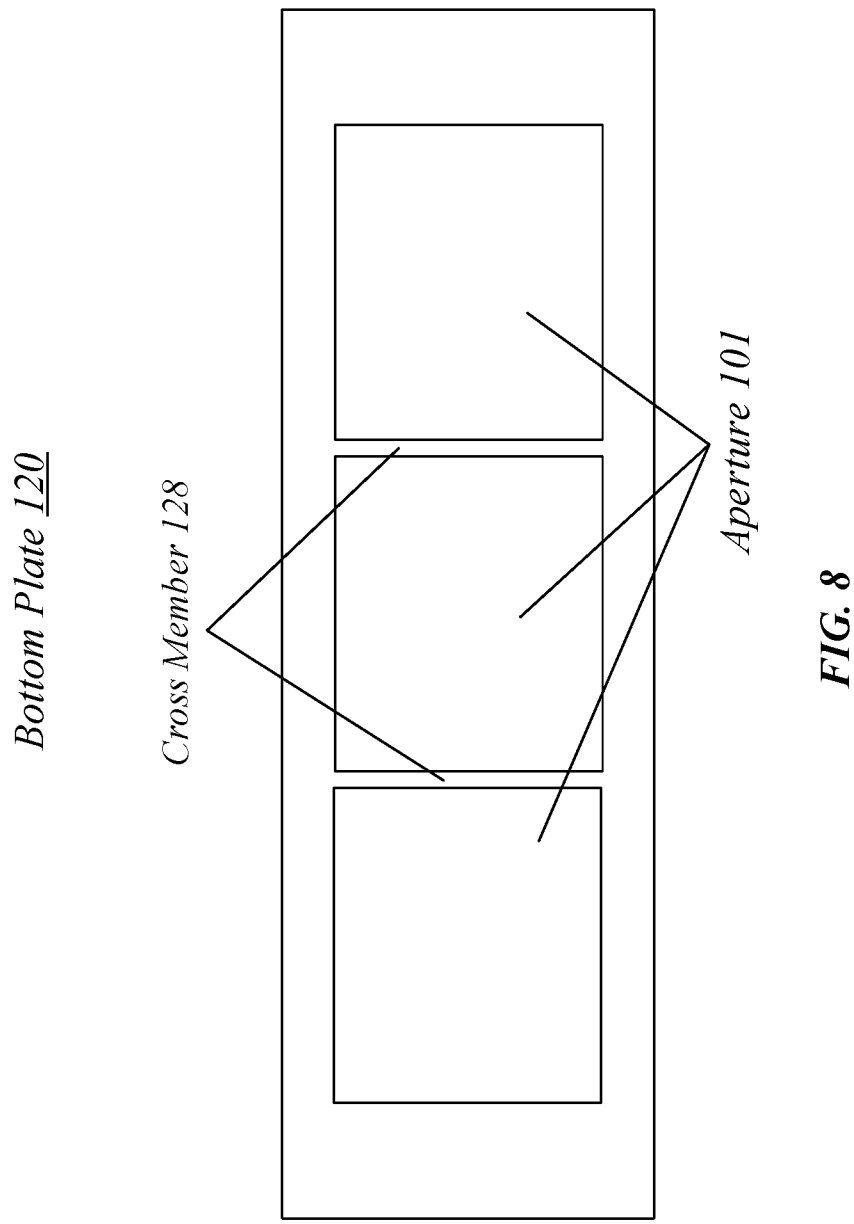
FIG. 8 illustrates a top view of a second example bottom plate of a retention plate system.

FIG. 8 illustrates a top view of an example implementation of the bottom plate 120. In some examples, the bottom plate 120 can include cross members 128 spanning the aperture 101. In general, the cross members 128 can be disposed to provide support to a flexible substrate during assembly of the retention plate system 100. In particular, during operation, a flexible substrate may initially be provided and disposed on the bottom plate 120. The cross members 128 may operate to support the flexible substrate until the top plate is disposed on the flexible substrate and lowered to stretch the flexible substrate and be retained in place (e.g. by magnets 128, or the like).

Figure 9:
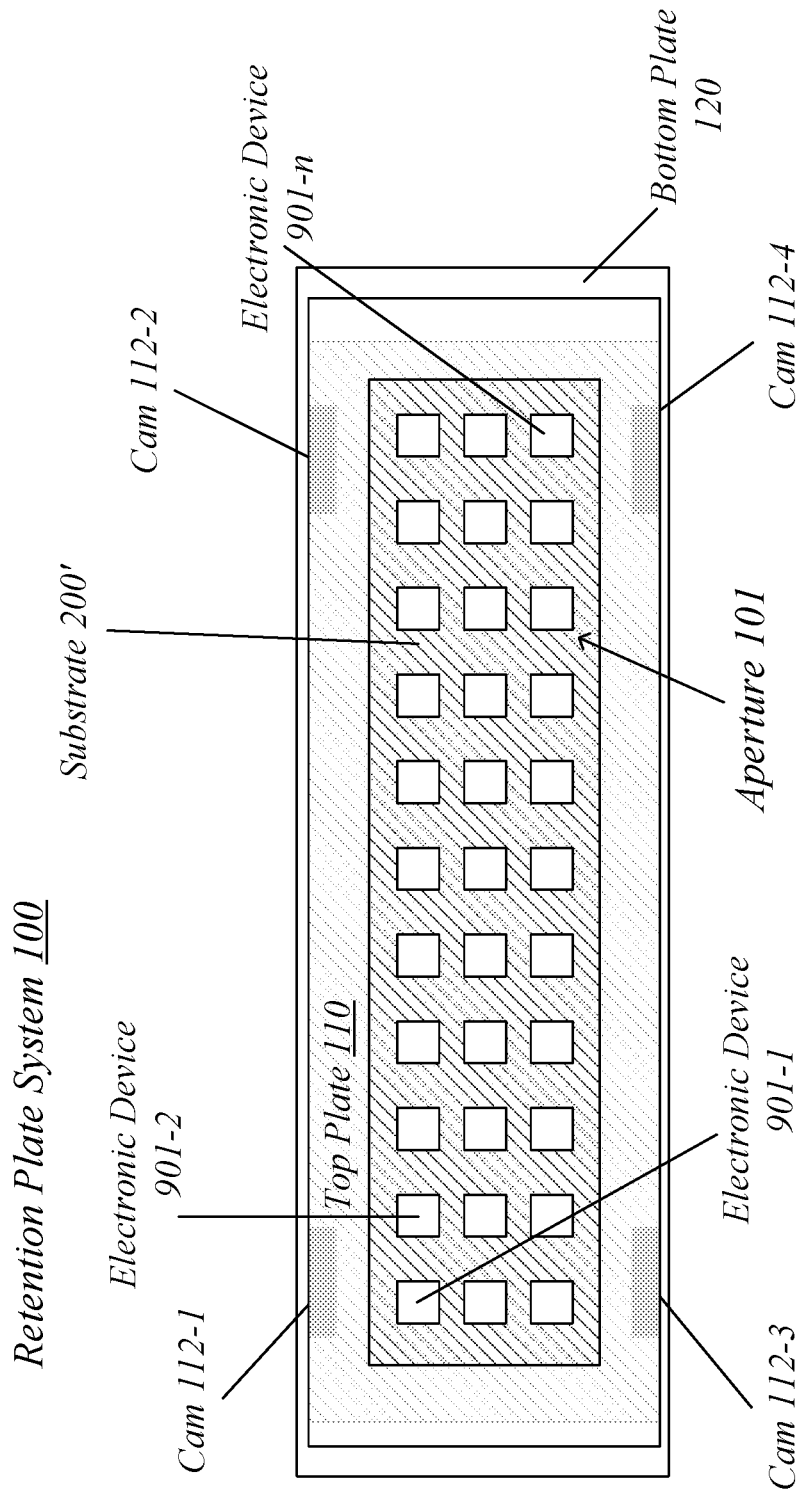
FIG. 9 illustrates an overhead view of the first example retention plate system and a flexible substrate.

FIG. 9 illustrates a top view of an example flexible substrate 200 disposed in retention plate system 100. In general, the retention plate system 100 can be implemented to fix the flexible substrate 200 to manufacture electronic devices 901 (e.g., circuits, processing components, or the like) onto flexible substrate 200. Any number of electronic devices 901 can be manufactured onto flexible substrate 200 via any of a variety of manufacturing processes. For example, electronic devices 901-1, 901-2, to 901-$n$ are depicted. The cam 112-1, 112-2, 112-3, and 112-4 can operate to stretch and retain flexible substrate 200 in a stretched state such that the flexible substrate 200 does not wrinkle and/or bend during processing.

Figure 10:
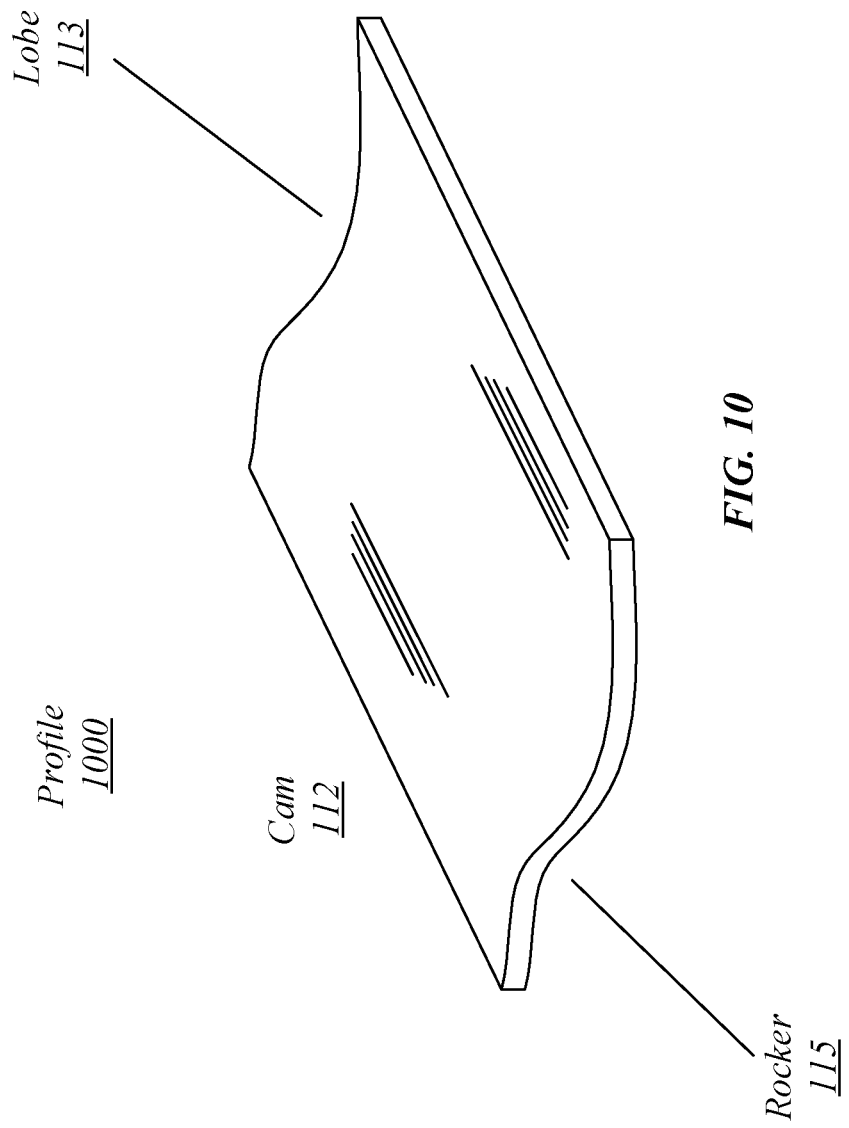
FIG. 10 illustrates an example cam profile.

FIG. 10 illustrates a perspective view of a cam profile, arranged according to an embodiment. In some examples, the cam 112 can be stamped from a metallic or plastic material to form a curved profile, such as, for example, the profile 1000 depicted in this figure. As depicted, the profile 1000 includes a curved radius for the lobes 113 and an opposing curved radius for a rocker 115. The lobe 113 and rocker 115 form the cam 112. It is noted, the dimension of the radius can depend upon the amount of force desired to be exerted upon a flexible substrate. Accordingly, examples, are not limited in this context.

Figure 11:
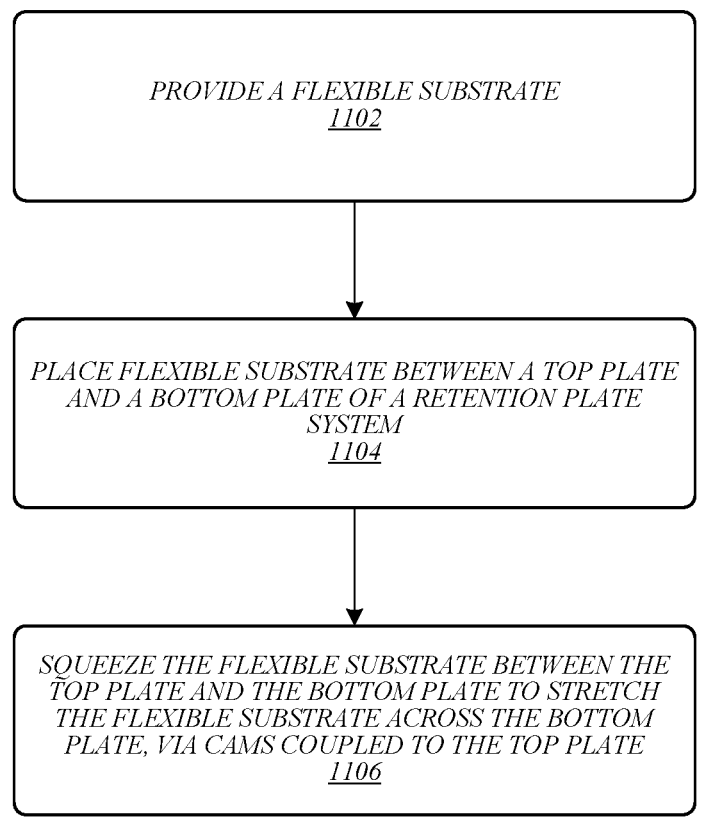
FIG. 11 illustrates an example process flow.

FIG. 11 illustrates an example of a process flow 1100 that may be representative of the implementation of one or more of the disclosed techniques according to some embodiments. For example, process flow 1100 may be representative of stretching the flexible substrate for processing depicted in FIGS. 2A-2C. As shown in this figure, a flexible substrate can be provided at 1102. For example, the flexible substrate 200 can be provided. At 1104, the flexible substrate can be placed between top and bottom plates of a retention plate system. For example, the flexible substrate 200 can be placed between the top plate 110 and bottom plate 120 of the retention plate system 100. At 1106, the flexible substrate can be squeezed between the top plate and the bottom plate to stretch the flexible substrate across the bottom plate via cams coupled to the top plate. For example, the flexible substrate 200 can be compressed between the top plate 110 and bottom plate 120 while the cams 112 operate to stretch the flexible substrate 200 across the bottom plate 120.

Figure 12:
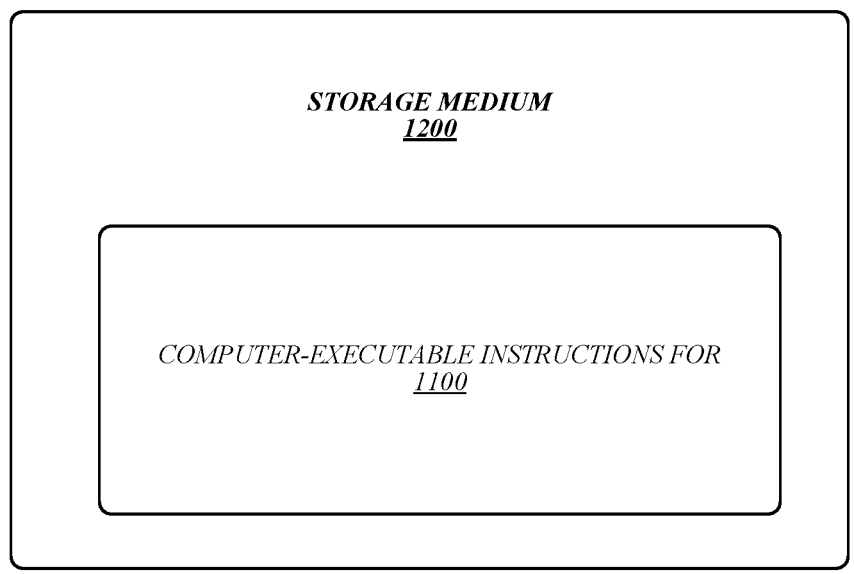
FIG. 12 illustrates an example storage medium.

FIG. 12 illustrates an embodiment of a storage medium 1200. Storage medium 1200 may comprise any computer-readable storage medium or machine-readable storage medium, such as an optical, magnetic or semiconductor storage medium. In various embodiments, storage medium 1200 may comprise an article of manufacture. In some embodiments, storage medium 1200 may comprise a non-transitory storage medium. In some embodiments, storage medium 1200 may store computer-executable instructions, such as computer-executable instructions to implement process flow 1100 of FIG. 11. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

Figure 13:
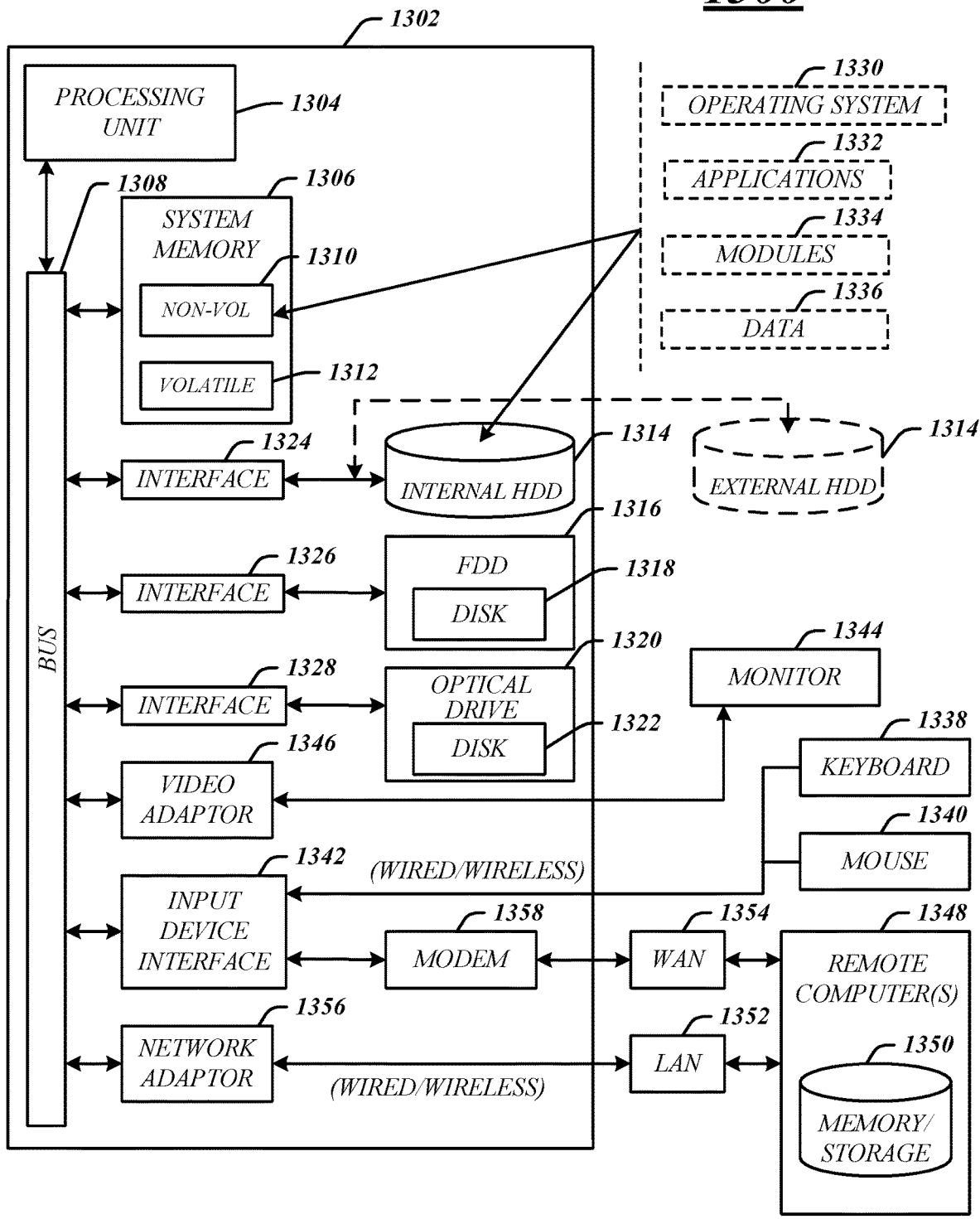
FIG. 13 illustrates an embodiment of a computing architecture.

FIG. 13 illustrates an embodiment of an exemplary computing architecture 1300 that may be suitable for implementing various embodiments as previously described. In various embodiments, the computing architecture 1300 may comprise or be implemented as part of an electronic device. In some embodiments, the computing architecture 1300 may be representative of a computing device that comprises a structure featuring an electronic assembly constructed on a flexible substrate stretched in retention plate system, such as one or more of the retention plate systems process FIG. 1, 3, 4, or 5, the top plate of FIG. 6, or the bottom plates of FIG. 6, or 7. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1300. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1300 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1300.

As shown in FIG. 13, according to computing architecture 1300, a computer 1302 comprises a processing unit 1304, a system memory 1306 and a system bus 1308. In some embodiments, computer 1302 may comprise a server. In some embodiments, computer 1302 may comprise a client. The processing unit 1304 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1304.

The system bus 1308 provides an interface for system components including, but not limited to, the system memory 1306 to the processing unit 1304. The system bus 1308 can be any of several types of bus structure that may further interconnect to a memory bus (with or without a memory controller), a peripheral bus, and a local bus using any of a variety of commercially available bus architectures. Interface adapters may connect to the system bus 1308 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1306 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 13, the system memory 1306 can include non-volatile memory 1310 and/or volatile memory 1312. A basic input/output system (BIOS) can be stored in the non-volatile memory 1310.

The computer 1302 may include various types of computer-readable storage media in the form of one or more lower speed memory units, including an internal (or external) hard disk drive (HDD) 1314, a magnetic floppy disk drive (FDD) 1316 to read from or write to a removable magnetic disk 1318, and an optical disk drive 1320 to read from or write to a removable optical disk 1322 (e.g., a CD-ROM or DVD). The HDD 1314, FDD 1316 and optical disk drive 1320 can be connected to the system bus 1308 by a HDD interface 1324, an FDD interface 1326 and an optical drive interface 1328, respectively. The HDD interface 1324 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 1310, 1312, including an operating system 1330, one or more application programs 1332, other program modules 1334, and program data 1336.

A user can enter commands and information into the computer 1302 through one or more wire/wireless input devices, for example, a keyboard 1338 and a pointing device, such as a mouse 1340. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1304 through an input device interface 1342 that is coupled to the system bus 1308, but can be connected by other interfaces such as a parallel port, IEEE 1394 serial port, a game port, a USB port, an IR interface, and so forth.

A monitor 1344 or other type of display device is also connected to the system bus 1308 via an interface, such as a video adaptor 1346. The monitor 1344 may be internal or external to the computer 1302. In addition to the monitor 1344, a computer typically includes other peripheral output devices, such as speakers, printers, and so forth.

The computer 1302 may operate in a networked environment using logical connections via wire and/or wireless communications to one or more remote computers, such as a remote computer 1348. The remote computer 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1350 is illustrated. The logical connections depicted include wire/wireless connectivity to a local area network (LAN) 1352 and/or larger networks, for example, a wide area network (WAN) 1354. Such LAN and WAN networking environments are commonplace in offices and companies, and facilitate enterprise-wide computer networks, such as intranets, all of which may connect to a global communications network, for example, the Internet.

When used in a LAN networking environment, the computer 1302 is connected to the LAN 1352 through a wire and/or wireless communication network interface or adaptor 1356. The adaptor 1356 can facilitate wire and/or wireless communications to the LAN 1352, which may also include a wireless access point disposed thereon for communicating with the wireless functionality of the adaptor 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wire and/or wireless device, connects to the system bus 1308 via the input device interface 1342. In a networked environment, program modules depicted relative to the computer 1302, or portions thereof, can be stored in the remote memory/storage device 1350. It will be appreciated that the network connections shown are exemplary and other means of establishing a communications link between the computers can be used.

The computer 1302 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The following examples are provided.

Example 1

A retention plate system, comprising: a bottom plate having a top surface to support a flexible substrate; and a top plate having a plurality of cams disposed on a bottom surface of the top plate, the cams positioned on the bottom surface to engage respective ends of the flexible substrate, and compress each end of the flexible substrate between the cams and the top surface of the bottom plate as a distance between the top plate and the bottom plate decreases.

Example 2

The retention plate system of claim 1, the cams to increase an amount of tension applied to respective ends of the flexible substrate in lateral directions away from a center of the flexible substrate as the distance between the top plate and the bottom plate decreases.

Example 3

The retention plate system of claim 2, the flexible substrate comprising at least one wrinkles, the tension to stretch the flexible substrate to remove the at least one wrinkle from the flexible substrate.

Example 4

The retention plate system of claim 2, the tension to stretch the flexible substrate into a substantially flat plane parallel to a plane for the top and bottom plates.

Example 5

The retention plate system of any one of claims 3 to 4, the top plate comprising an aperture to expose a portion of the stretched flexible substrate.

Example 6

The retention plate system of any one of claims 3 to 4, the bottom plate comprising an aperture to expose a portion of the stretched flexible substrate.

Example 7

The retention plate system of claim 6, the bottom plate comprising at least one cross member spanning the aperture to support the flexible substrate.

Example 8

The retention plate system of any one of claims 3 to 4, the top plate comprising a first aperture to expose a first portion of a first surface of the stretched flexible substrate and the bottom plate comprising a second aperture to expose a second portion of a second surface of the stretched flexible substrate.

Example 9

The retention plate system of claim 1, the bottom plate comprising a plurality of magnets to hold the top plate against the bottom plate.

Example 10

The retention plate system of claim 1, the plurality of cams a first set of cams, the bottom plate comprising a second set of cams to stretch the flexible substrate across the bottom plate.

Example 11

The retention plate system of claim 1, the bottom plate comprising a plurality of rollers, the flexible substrate to slide over the rollers to a stretched position.

Example 12

The retention plate system of claim 1, the plurality of cams comprising a coating to increase a friction between the plurality of cams and the flexible substrate.

Example 13

The retention plate system of claim 1, the bottom plate comprising a coating to reduce a friction between the bottom plate and the flexible substrate.

Example 14

A retention plate system, comprising: a bottom plate to support a flexible substrate; and a top plate, the top plate comprising a plurality of cams to stretch the flexible substrate across the bottom plate.

Example 15

The retention plate system of claim 14, the top plate comprising an aperture to expose a portion of the flexible substrate.

Example 16

The retention plate system of claim 14, the bottom plate comprising an aperture to expose a portion of the flexible substrate.

Example 17

The retention plate system of claim 16, the bottom plate comprising at least one cross member spanning the aperture to support the flexible substrate.

Example 18

The retention plate system of claim 14, the top plate comprising a first aperture to expose a first portion of a first surface of the flexible substrate and the bottom plate comprising a second aperture to expose a second portion of a second surface of the flexible substrate.

Example 19

The retention plate system of claim 14, the bottom plate comprising a plurality of magnets to hold the top plate against the bottom plate.

Example 20

The retention plate system of claim 14, the plurality of cams a first set of cams, the bottom plate comprising a second set of cams to stretch the flexible substrate across the bottom plate.

Example 21

The retention plate system of claim 14, the bottom plate comprising a plurality of rollers, the flexible substrate to slide over the rollers to a stretched position.

Example 22

The retention plate system of claim 14, the plurality of cams comprising a coating to increase a friction between the plurality of cams and the flexible substrate.

Example 23

The retention plate system of claim 14, the bottom plate comprising a coating to reduce a friction between the bottom plate and the flexible substrate.

Example 24

An apparatus to retain a flexible substrate in a stretched state, the apparatus comprising: a pair of plates to receive a flexible substrate and squeeze the flexible substrate between the pair of plates; and a set of cams operable coupled to a first one of the pair of plates and positioned opposite a second one of the pair of plates, the cams to stretch the flexible substrate across the second one of the pair of plates as the flexible substrate is squeezed between the pair of plates.

Example 25

The apparatus of claim 24, at least one plate of the pair of plates comprising an aperture to expose a portion of the flexible substrate.

Example 26

The apparatus of claim 25, the at least one plate of the pair of plates comprising at least one cross member spanning the aperture.

Example 27

The apparatus of claim 24, at least one plate of the pairs of plates comprising a plurality of magnets to hold the pair of plates against each other.

Example 28

The apparatus of claim 24, the set of cams a first set of cams, the apparatus comprising a second set of cams operably coupled to the second one of the pair of plates opposing the first set of cams.

Example 29

The apparatus of claim 24, comprising a set of rollers operably coupled to the second one of the pair of plates.

Example 30

The apparatus of claim 24, each cam of the set of cams comprising a coating to increase a friction between each of the cams and the flexible substrate.

Example 31

The apparatus of claim 24, the second one of the pair of plates comprising a coating to reduce a friction between the second one of the pair of plates and the flexible substrate.

Example 32

A method comprising: providing a flexible substrate; placing the flexible substrate between a top plate and a bottom plate of a retention plate system, the top plate comprising a plurality of cams disposed opposite the bottom plate; and squeezing the flexible substrate between the top plate and the bottom plate to stretch the flexible substrate between the cams.

Example 33

The method of claim 32, comprising exposing a stretched portion of the flexible substrate through an aperture of the top plate or the bottom plate to process the flexible substrate in an electronic device manufacturing process.

Example 34

The method of claim 32, comprising supporting the flexible substrate on a cross member of the bottom plate before squeezing the flexible substrate between the top plate and the bottom plate.

Example 35

The method of claim 32, comprising holding the top plate in proximity to the bottom via a plurality of magnets.

Example 36

The method of claim 32, the plurality of cams a first set of cams, the bottom plate comprising a second set of cams to stretch the flexible substrate across the bottom plate.

Example 37

The method of claim 32, the bottom plate comprising a plurality of rollers, the flexible substrate to slide over the rollers to a stretched position.

Example 38

The method of claim 32, the plurality of cams comprising a coating to increase a friction between the plurality of cams and the flexible substrate.

Example 39

The method of claim 32, the bottom plate comprising a coating to reduce a friction between the bottom plate and the flexible substrate.

What is claimed is:
1. An apparatus to retain a flexible substrate in a stretched state, the apparatus comprising:
a pair of plates to receive a flexible substrate and squeeze the flexible substrate between the pair of plates; and
a set of cams operably coupled to a first one of the pair of plates, the set of cams comprising at least:
a first cam disposed on a surface of a first one of the pair of plates and positioned opposite a second one of the pair of plates, the first cam comprising a lobe arranged to engage a first end of the flexible substrate; and a second cam disposed on the surface of the first one of the pair of plates and positioned opposite the second one of the pair of plates, the second cam comprising a lobe arranged to engage a second end of the flexible substrate, wherein the first cam and the second cam are oriented with respect to each other such that the lobe of the first cam and the lobe of the second cam are in a first position having a first distance between a point on the lobe of the first cam and a point on the lobe of the second cam and in a second position having a second distance between the point on the lobe of the first cam and the point on the lobe of the second cam, the second distance greater than the first distance.

2. The apparatus of claim 1, at least one plate of the pair of plates comprising an aperture to expose a portion of the flexible substrate to an environment external to the pair of plates.

3. The apparatus of claim 1, at least one plate of the pairs of plates comprising a plurality of magnets to hold the at least one plate of the pair of plates against the other of the at least one plate of the pair of plates.

4. The apparatus of claim 1, the set of cams comprising a first set of cams, the apparatus comprising a second set of cams operably coupled to a second one of the pair of plates opposing the first set of cams.

5. The apparatus of claim 1, comprising a set of rollers operably coupled to a second one of the pair of plates.

6. The apparatus of claim 1, each cam of the set of cams comprising a coating to increase a friction between each cam of the set of cams and the flexible substrate.

7. The apparatus of claim 1, a second plate of the pair of plates comprising a coating to reduce a friction between the second plate and the flexible substrate.

8. A retention plate system, comprising:
   a bottom plate having a top surface to support a flexible substrate;
   a top plate having a bottom surface facing the top surface of the bottom plate;
   a first cam disposed on the bottom surface and comprising a lobe arranged to engage a first end of the flexible substrate; and
   a second cam disposed on the bottom surface and comprising a lobe arranged to engage a second end of the flexible substrate,
   wherein the first cam and the second cam are oriented with respect to each other such that the lobe of the first cam and the lobe of the second cam are in a first position having a first distance between a point on the lobe of the first cam and a point on the lobe of the second cam and in a second position having a second distance between the point on the lobe of the first cam and the point on the lobe of the second cam, the second distance greater than the first distance.

9. The retention plate system of claim 8, wherein the lobe of the first cam and the lobe of the second cam transition from the first position to the second position as a distance between the top plate and the bottom plate decreases to increase an amount of tension applied to the flexible substrate.

10. The retention plate system of claim 9, the flexible substrate comprising at least one wrinkle, the tension to stretch the flexible substrate to remove the at least one wrinkle from the flexible substrate.

11. The retention plate system of claim 9, the tension to stretch the flexible substrate into a substantially flat plane parallel to a plane of the top plate or bottom plate.

12. The retention plate system of claim 11, at least one of the top plate or the bottom plate comprising an aperture to expose a portion of the stretched flexible substrate to an environment external to the top plate or the bottom plate.

13. The retention plate system of claim 12, the bottom plate comprising at least one cross member spanning the aperture to support the flexible substrate.

14. The retention plate system of claim 8, the bottom plate comprising a plurality of magnets to hold the top plate against the bottom plate.

15. The retention plate system of claim 8, the first cam and the second cam comprising a first set of cams, the bottom plate comprising a second set of cams to stretch the flexible substrate across the bottom plate.

16. The retention plate system of claim 8, the bottom plate comprising a plurality of rollers, the flexible substrate to slide over the rollers to a stretched position.

17. The retention plate system of claim 8, the first cam and the second cam comprising a coating to increase a friction between the first and the second cam and the flexible substrate.

18. The retention plate system of claim 8, the bottom plate comprising a coating to reduce a friction between the bottom plate and the flexible substrate.

19. A method comprising:
   providing a flexible substrate;
   placing the flexible substrate between a top plate and a bottom plate of the retention plate system of claim 8, the top plate comprising a plurality of cams disposed opposite the bottom plate; and
   squeezing the flexible substrate between the top plate and the bottom plate to stretch the flexible substrate between the cams.

20. The method of claim 19, comprising exposing a stretched portion of the flexible substrate, when the top plate and the bottom plate are in a closed configuration, through an aperture of the top plate or the bottom plate to process the flexible substrate in an electronic device manufacturing process.

21. The method of claim 19, comprising supporting the flexible substrate on a cross member of the bottom plate before squeezing the flexible substrate between the top plate and the bottom plate.

22. The method of claim 19, comprising holding the top plate in proximity to the bottom via a plurality of magnets.

23. The method of claim 19, the plurality of cams comprising a coating to increase a friction between the plurality of cams and the flexible substrate.

24. The method of claim 19, the bottom plate comprising a coating to reduce a friction between the bottom plate and the flexible substrate.

* * * * *